(12) United States Patent
Lee et al.

(10) Patent No.: US 12,176,400 B2
(45) Date of Patent: *Dec. 24, 2024

(54) BACKSIDE CONTACT WITH AIR SPACER

(71) Applicant: Taiwan Semiconductor Manufacturing Company, Ltd., Hsinchu (TW)

(72) Inventors: Chen-Ming Lee, Taoyuan County (TW); Wei-Yang Lee, Taipei (TW)

(73) Assignee: TAIWAN SEMINCODCUTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,637

(22) Filed: Jul. 24, 2023

(65) Prior Publication Data

US 2023/0369419 A1    Nov. 16, 2023

Related U.S. Application Data

(63) Continuation of application No. 17/813,822, filed on Jul. 20, 2022, now Pat. No. 11,798,996, which is a continuation of application No. 17/159,423, filed on Jan. 27, 2021, now Pat. No. 11,444,162.

(51) Int. Cl.
| | |
|---|---|
| *H01L 29/40* | (2006.01) |
| *H01L 21/283* | (2006.01) |
| *H01L 21/3213* | (2006.01) |
| *H01L 29/417* | (2006.01) |
| *H01L 29/66* | (2006.01) |
| *H01L 29/786* | (2006.01) |

(52) U.S. Cl.
CPC .......... *H01L 29/401* (2013.01); *H01L 21/283* (2013.01); *H01L 21/32135* (2013.01); *H01L 29/4175* (2013.01); *H01L 29/66795* (2013.01); *H01L 29/78696* (2013.01)

(58) Field of Classification Search
CPC . H01L 21/283; H01L 29/4175; H01L 29/785; H01L 29/401; H01L 21/7682; H01L 29/42392; H01L 21/76897; H01L 29/41766; H01L 29/0673; H01L 21/76831; H01L 29/41791; H01L 2221/1063; H01L 21/32135; B82Y 10/00
See application file for complete search history.

(56) References Cited

U.S. PATENT DOCUMENTS

| | | | |
|---|---|---|---|
| 11,437,283 B2 | 9/2022 | Lilak et al. | |
| 11,798,996 B2 * | 10/2023 | Lee | ........................ H01L 29/401 |
| 2008/0020488 A1 | 1/2008 | Clevenger et al. | |
| 2022/0139911 A1 | 5/2022 | Wei et al. | |

* cited by examiner

*Primary Examiner* — Changhyun Yi
(74) *Attorney, Agent, or Firm* — HAYNES AND BOONE, LLP

(57) ABSTRACT

A semiconductor structure includes an active region including a source/drain feature, a contact protruding from a bottom surface of the source/drain feature, a first dielectric layer disposed directly below the active region and surrounding the contact, an air gap disposed between the contact and the first dielectric layer, and a seal disposed between the contact and the first dielectric layer, such that the air gap is disposed between the seal and the source/drain feature.

20 Claims, 12 Drawing Sheets

BACKSIDE CONTACT WITH AIR SPACER

PRIORITY DATA

The present application is a continuation application of U.S. patent application Ser. No. 17/813,822, filed Jul. 20, 2022, which is a continuation of U.S. patent application Ser. No. 17/159,423, filed Jan. 27, 2021 and issued as U.S. Pat. No. 11,444,162, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
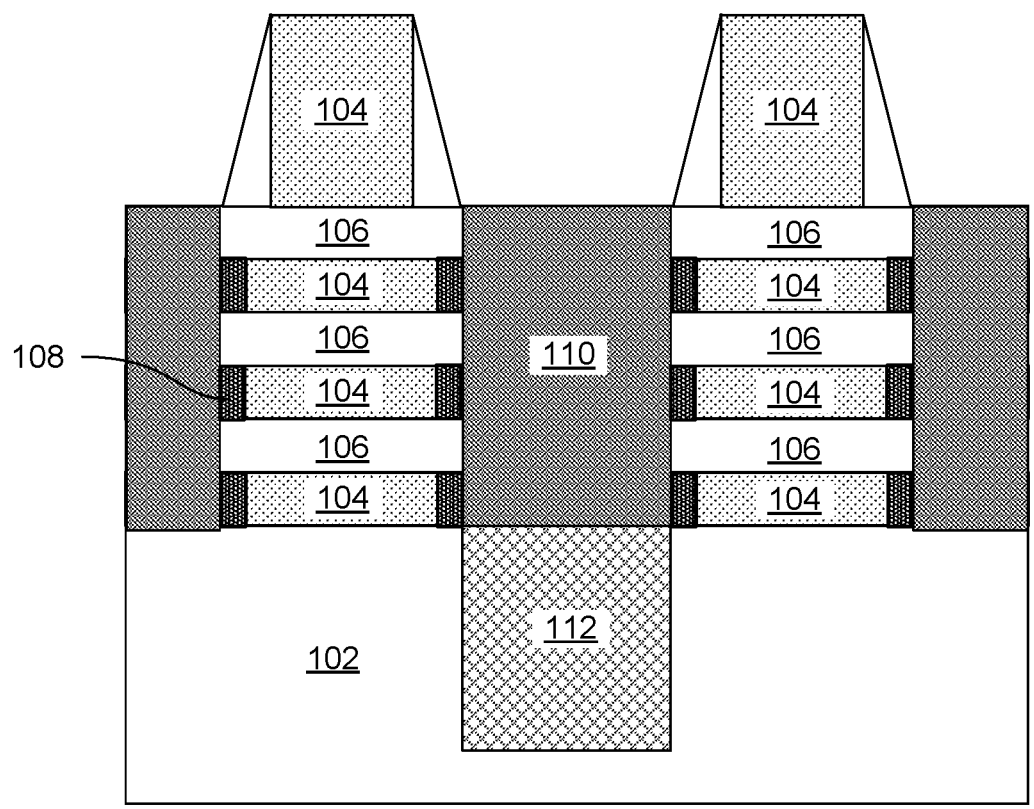
FIGS. 1A, 1B, 1C, 1D, 1E, 1F, 1G, 1H, 1I, 1J, and 1K are diagrams showing an illustrative process for forming a backside contact with an air spacer, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In some example embodiments, to form a GAA device, a semiconductor fin may include a total of three to ten alternating layers of semiconductor materials. For example, the first semiconductor material may be silicon, and the second semiconductor material may be silicon germanium. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

Alternating layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of semiconductor material that may be selectively etched. For example, a first type of semiconductor material may be epitaxially grown on a substrate. Then, a second type of semiconductor material may be epitaxially grown on that first layer. The process continues by forming alternating layers of the first and second semiconductor material. Then, the channel stacks may be patterned into fin structures. Each fin may thus be a fin stack of alternating semiconductor layers. Then, an etching process (e.g., a wet etching process) can be used to remove the second semiconductor material while leaving the first semiconductor material substantially intact. The remaining second semiconductor material may thus form a stack of nanowires or nanosheets extending between two active regions. A gate device can then be formed to completely surround each of the nanowires or nanosheets. On each side of the gate device is a source or drain region.

In conventional fabrication techniques, source/drain features are formed by performing an etching process to form recesses for both the source and drain features. Such recesses are typically formed at a similar depth. Then, an epitaxial growth process is used to grow the source and drain structures within the recesses. In some cases, after the source and drain structures have been formed, a backside contact to the source structure may be formed. Forming a backside contact may involve patterning the backside of the wafer to expose the bottom of the source structure and them forming a conductive contact structure to connect to the source structure. In some cases, forming a backside contact may involve etching the trench for a source/drain structure deeper and filling the bottom with a sacrificial dummy contact structure. After flipping the semiconductor substrate to perform backside processing, portions of the substrate are removed to expose the dummy contact structure. The dummy contact structure can then be replaced with a conductive (i.e., metal) structure. It is desirable to improve the effectiveness of this backside contact.

According to principles described herein, the backside contact includes an air spacer (also referred to as an air gap) along the sides. This air spacer may be formed by depositing a sacrificial material along sidewalls of the trench left by removing the dummy contact structure. Then, a dielectric layer may be deposited over the sacrificial metal layer. After the dielectric layer is formed, a metal or other conductive material is used to fill the trench. The sacrificial material can then be removed. This leaves an air gap surrounding the metal contact. The air gap provides for reduced capacitance, which can improve the performance of the device.

FIGS. 1A, 1B, 1C, 1D, 1E, 1F, 1G, 1H, 1I, 1J, and 1K are diagrams showing an illustrative process for forming an enlarged backside contact with a wider portion and a narrower portion. FIG. 1A is a diagram showing a cross-sectional view of an illustrative workpiece. The workpiece includes a semiconductor substrate 102. The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

FIG. 1A illustrates fin stacks that include several channel regions 106 or nanostructures surrounded by gate structures 104. Between the fin stacks are source or drain structures 110. Inner spacers 108 are placed along the gate structures 104 between channels 106 to isolate the gate structure 104 from the source or drain structure 110.

To form this structure, a first type semiconductor layer is deposited on the substrate 102. The first type semiconductor material is a sacrificial material that will ultimately be removed. Thus, this layer will also be referred to as the sacrificial semiconductor layer. Then, a second type semiconductor material is deposited. The second type semiconductor layer will ultimately form part of the channel of a nanostructure transistor device. Thus, the second type semiconductor layer will also be referred to as a channel conductor layer. Formation of both the first type semiconductor material and the second type semiconductor material may be done using an epitaxial growth process. The process of forming the first type semiconductor material and the second type semiconductor material may be repeated until the desired number of layers are reached. After the desired number of semiconductor layers has been achieved, a dummy gate structure that will eventually be replaced with a real metal or conductive gate may be formed on top.

A patterning process is then used to form recesses within the semiconductor layers in the regions where the source and drain structures 110 are to be formed. The patterning process may include a photolithographic process. For example, a hard mask layer and a photoresist layer may be deposited upon the workpiece. The hardmask layer may include at least one of silicon oxide ($SiO_2$), silicon nitride (SiN), silicon carbide (SiC), silicon oxynitride (SiON), silicon oxycarbide (SiOCN), hafnium oxide ($HfO_2$), aluminum oxide ($Al_2O_3$), and zirconium oxide ($ZrO_2$).

Then, the photoresist layer may be exposed to a light source through a photomask. The photoresist may then be developed. Then, an etching process may be applied to transfer the pattern in the photoresist to the hard mask layer. After this process, the hard mask exposes portions of the alternating set of layers. Then, a directional etching process such as a dry etching process is used to pattern the semiconductor layers.

A lateral etching process is used to partially remove the sacrificial semiconductor layers where the inner spacers 108 are to be formed. The lateral etching process may be, for example, a wet etching process. In some examples, a dry etching process may also be used. The etching process may be designed to be selective so as to remove the sacrificial semiconductor layer without substantially affecting the semiconductor layer. For example, in the case where the sacrificial semiconductor layer is silicon germanium and the semiconductor layer is silicon, then the etching process may be configured to remove silicon germanium without substantially affecting silicon.)

Then, a deposition process is applied to form the inner spacers 108. Specifically, the inner spacer layer 120 is formed by a conformal deposition process so that the inner spacer layer is formed along sidewalls of the recesses where the source or drain structures 110 are to be formed. The inner spacer layer may be a dielectric material such as SiCN, SiOCN, or SiON or $SiO_2$.

An etch back process may then be used to remove portions of the inner spacer layer and to expose the channel layers 106. The etch back process also removes the inner spacer layer from the floor of the recesses and the top of the workpiece. The remaining portions of the inner spacer layers serve to electrically isolate the portions of the gate structure 104 with the source and drain regions to be formed. In some examples, the remaining inner spacer layer may vary within a range of width between about 4-15 nanometers.

To form the backside contact, the trench where the source/drain region is formed is further etched to create a deeper trench. This etching process may extend the depth of the recess another 45-65 nanometers. Then, the dummy contact structure 112 may be formed at the bottom of the trench. This may be done using an epitaxial growth process. The dummy contact structure may be, for example, made of silicon germanium without dopants. In some examples, the ratio of germanium to silicon in the silicon germanium may be within a range of about 30-40 percent.

After the dummy contact structure 112 is formed, then the source/drain structures 110 can be formed. In some examples, the source and drain structures 110 are created by performing an epitaxial growth process. An epitaxial growth process involves forming a crystal structure on a crystal substrate. In the present example, the source and drain regions 110 are grown from the dummy contact structure 112 and channel regions 106. In some examples, the source and drain regions 110 may be doped in situ so as to obtain the desired properties.

After the source/drain structures 110 are formed, the dummy gate structure and the sacrificial semiconductor material may be replaced with a real gate 104. This may be done by removing the sacrificial semiconductor materials and the dummy gate structure with a wet etching process. The wet etching process may be selective so as to remove the sacrificial semiconductor layers leaving the channel layers 106 substantially intact. The wet etching process may use an acid-based etchant such as: sulfuric acid (H2SO4), perchloric acid (HClO4), hydroiodic acid (HI), hydrobromic acid (HBr), nitric acid (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH). A dry etching process may also be used, with HF or F2 gas, for example. By removing the sacrificial semiconductor layers, the channel layers 106 thus become nanostructures extending between source and drain structures 110.

After the dummy gate structure is removed, a real gate structure is formed. Formation of the real gate device may include a number of steps. For example, a high-k dielectric layer may be deposited so as to surround the channel layers 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer may be deposited. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). Then, a gate layer is deposited. The gate layer may be a conductive material such as a metal material. In this manner, the gate layer entirely surrounds each of the channel layers 106.

Figure 1B:
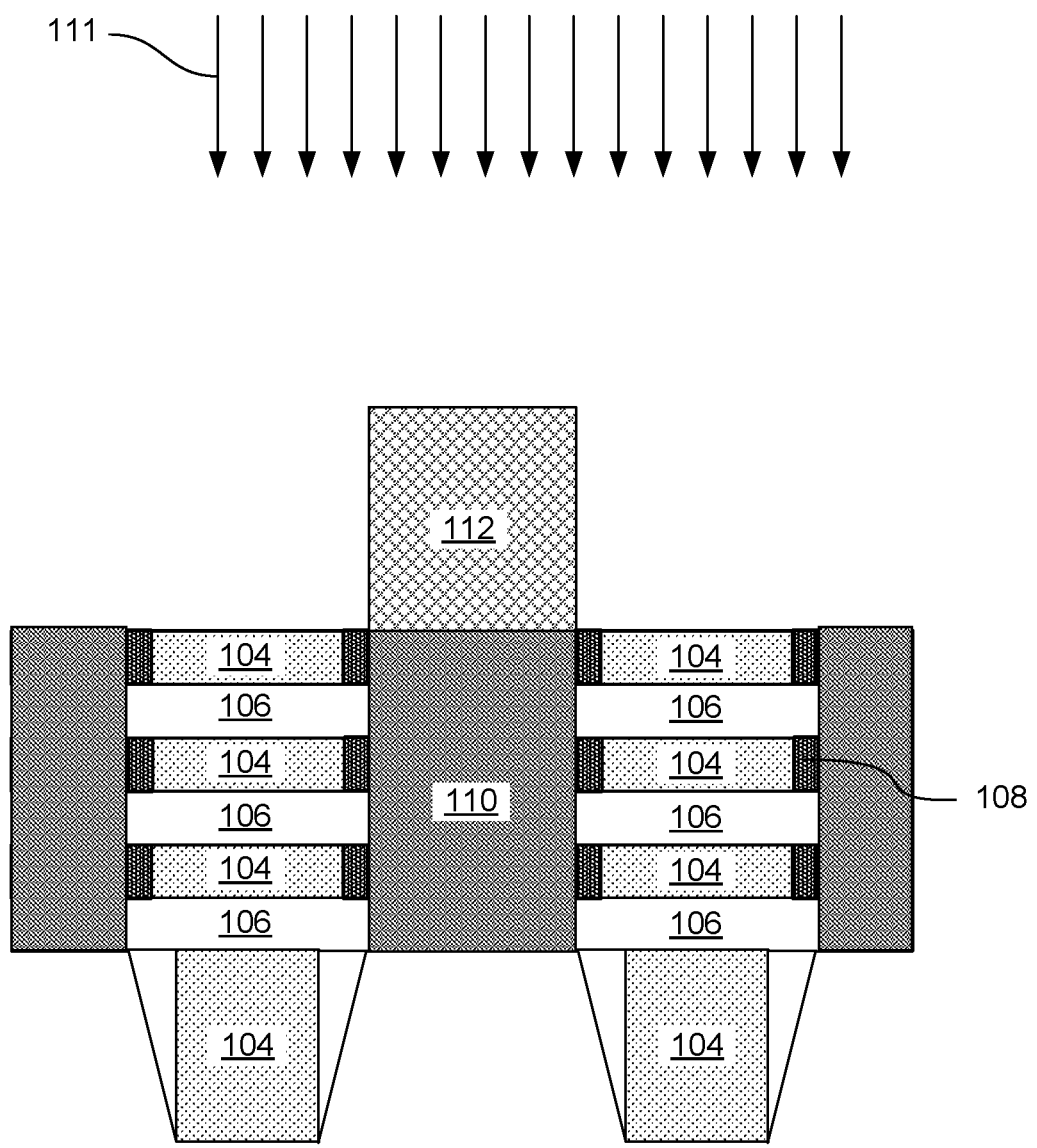

FIG. 1B illustrates the beginning of a Back-End-of-Line (BEOL) process to form a backside contact with an air gap. To do this, a removal process 111 is applied to the backside of the workpiece to remove the backside portion of the substrate 102 and expose the dummy contact structure 112. This removal process may be, for example, a wet etching process. The wet etching process may be selective so as to remove the semiconductor substrate 102 while leaving the dummy source contact structure 112 substantially intact.

Figure 1C:
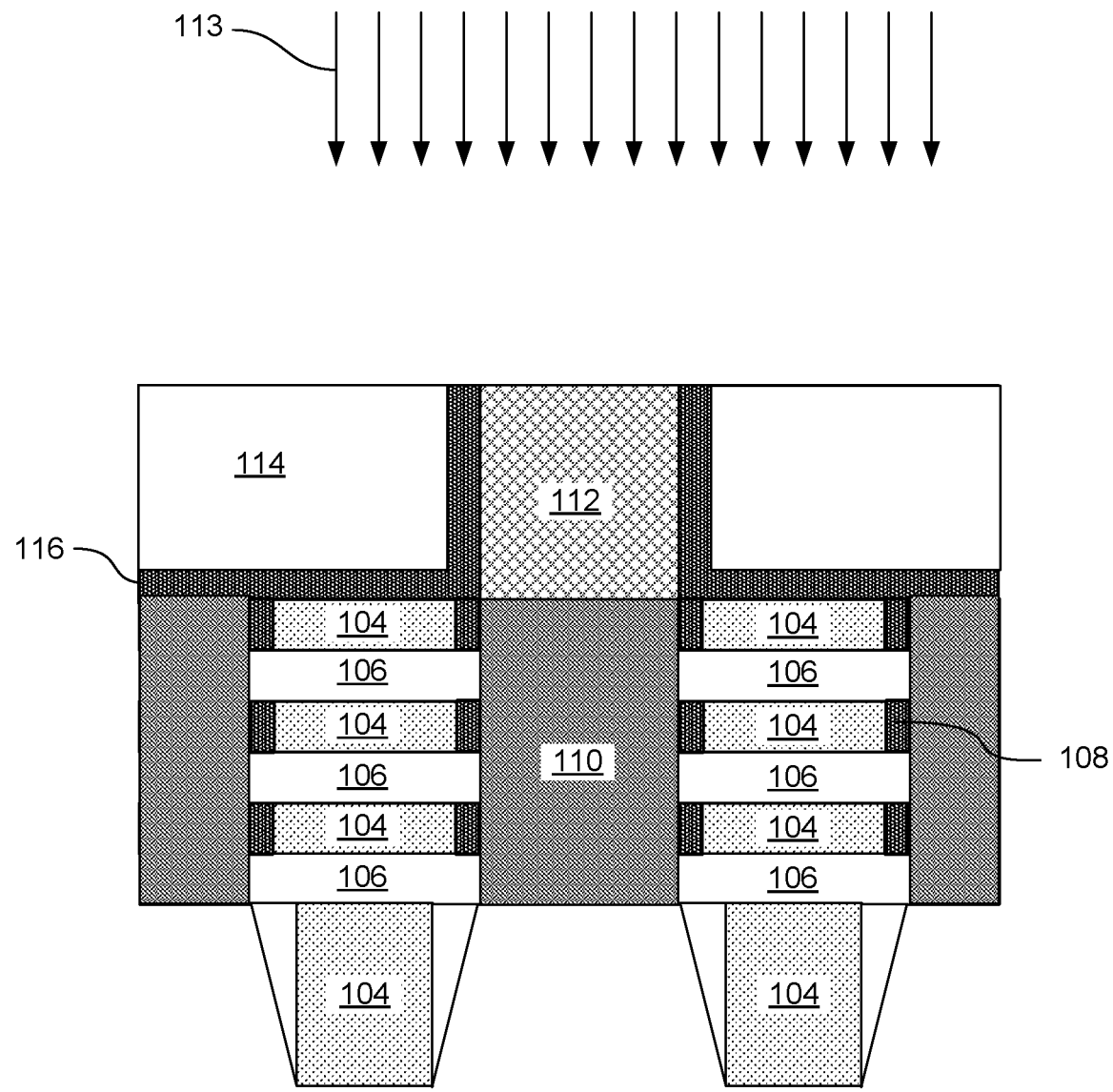

FIG. 1C illustrates a formation process 113 to form a first dielectric layer 116 around the dummy contact structure 112, as well as an oxide layer 114 over the first dielectric layer 116. After both the first dielectric layer 116 and the oxide layer 114 is formed, a CMP process may be applied to planarize the surface of the workpiece. The first dielectric layer 116 surrounding the dummy contact structure 112. The dielectric layer 116 may be, for example, a SiN layer (ALD deposition). The dielectric layer 116 may be formed using a deposition process such as atomic layer deposition (ALD), or chemical vapor deposition (CVD).

Figure 1D:
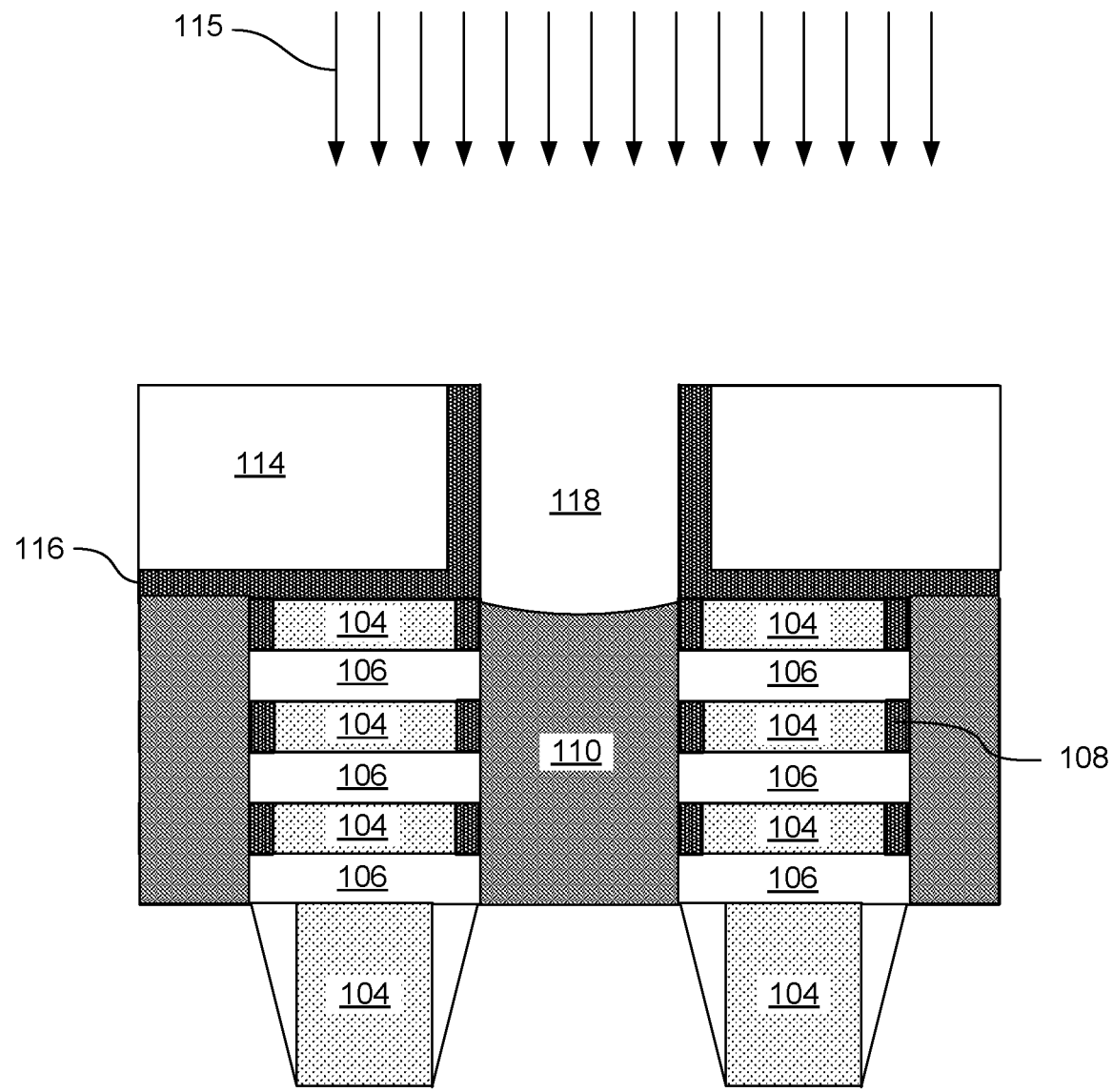

FIG. 1D illustrates an etch-back process 115 by which the dummy contact SiGe structure 112 is removed. This etching process is selective so that the dummy structure is removed while the first dielectric layer 116 and the oxide layer 114 are left substantially intact. The etch-back process 115 may be an anisotropic etching process such as a dry-etching process. The etch-back process leaves an opening 118.

Figure 1E:
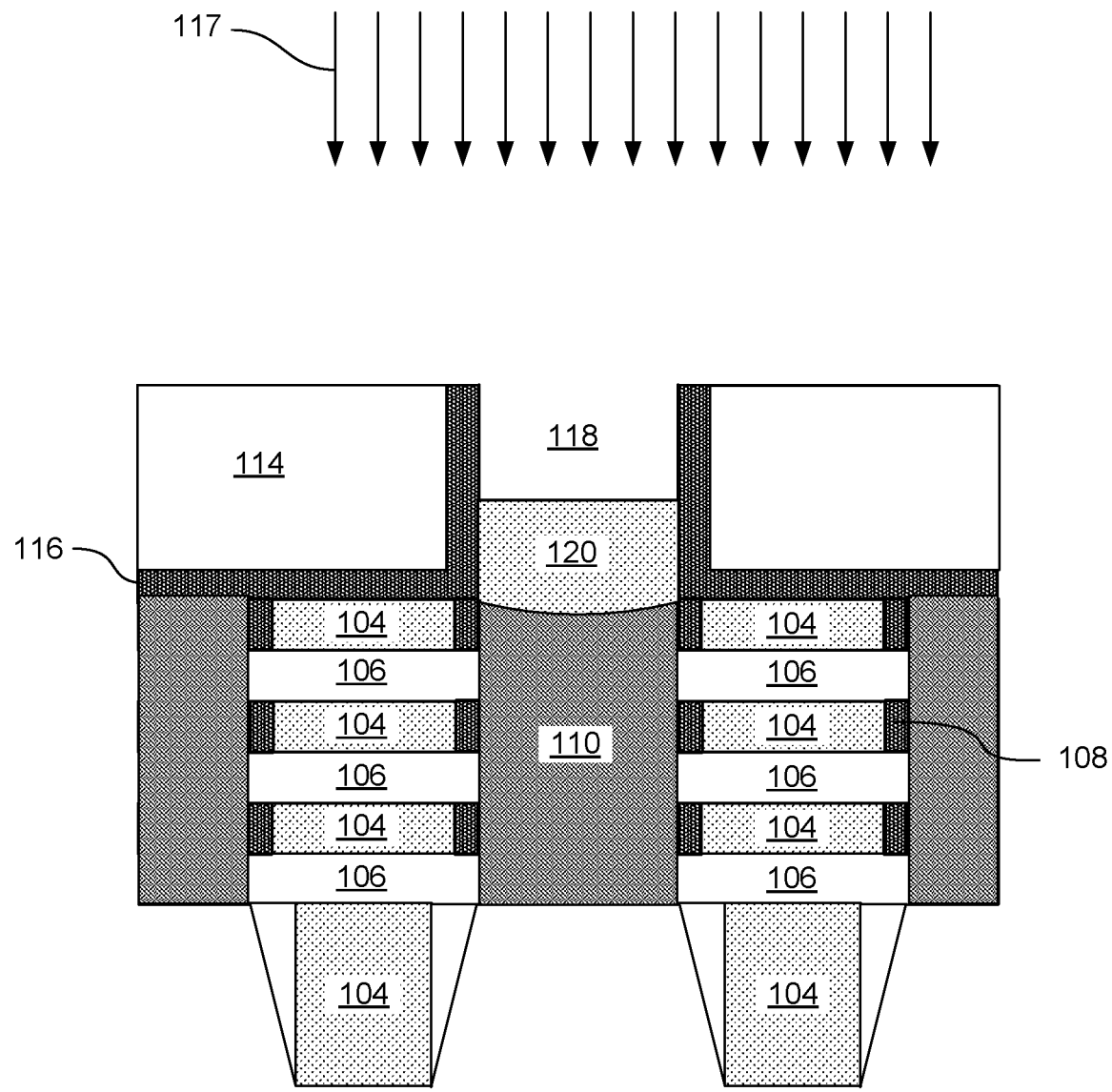

FIG. 1E illustrates a process 117 by which a BARC layer is deposited within the opening 118 and then partially etched back. The etching process may be a dry etching process 117. The BARC (bottom anti-reflective coating) is used to protect other portions of the workpieces, such as a source side epitaxial growth process.

Figure 1F:
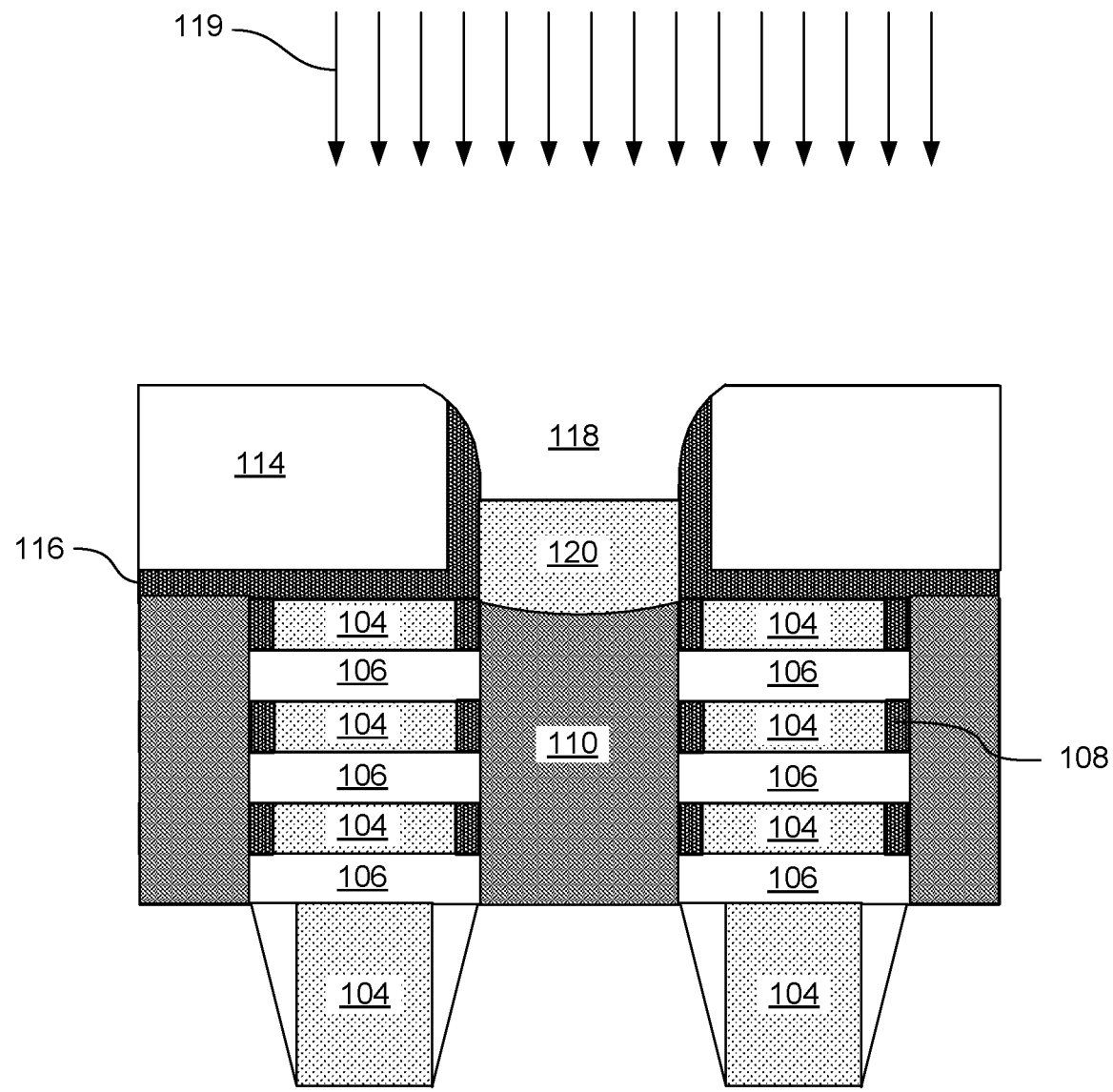

FIG. 1F illustrates a process 119 to enlarge the back-side contact opening for back-side contact metal gap fill. This may be done, for example, by an isotropic dry etch process to remove the oxide layer 114 and the first dielectric layer 116 in a manner such that the top corners of the opening are rounded. Then, an ash process can be used to remove the BARC layer 120.

Figure 1G:
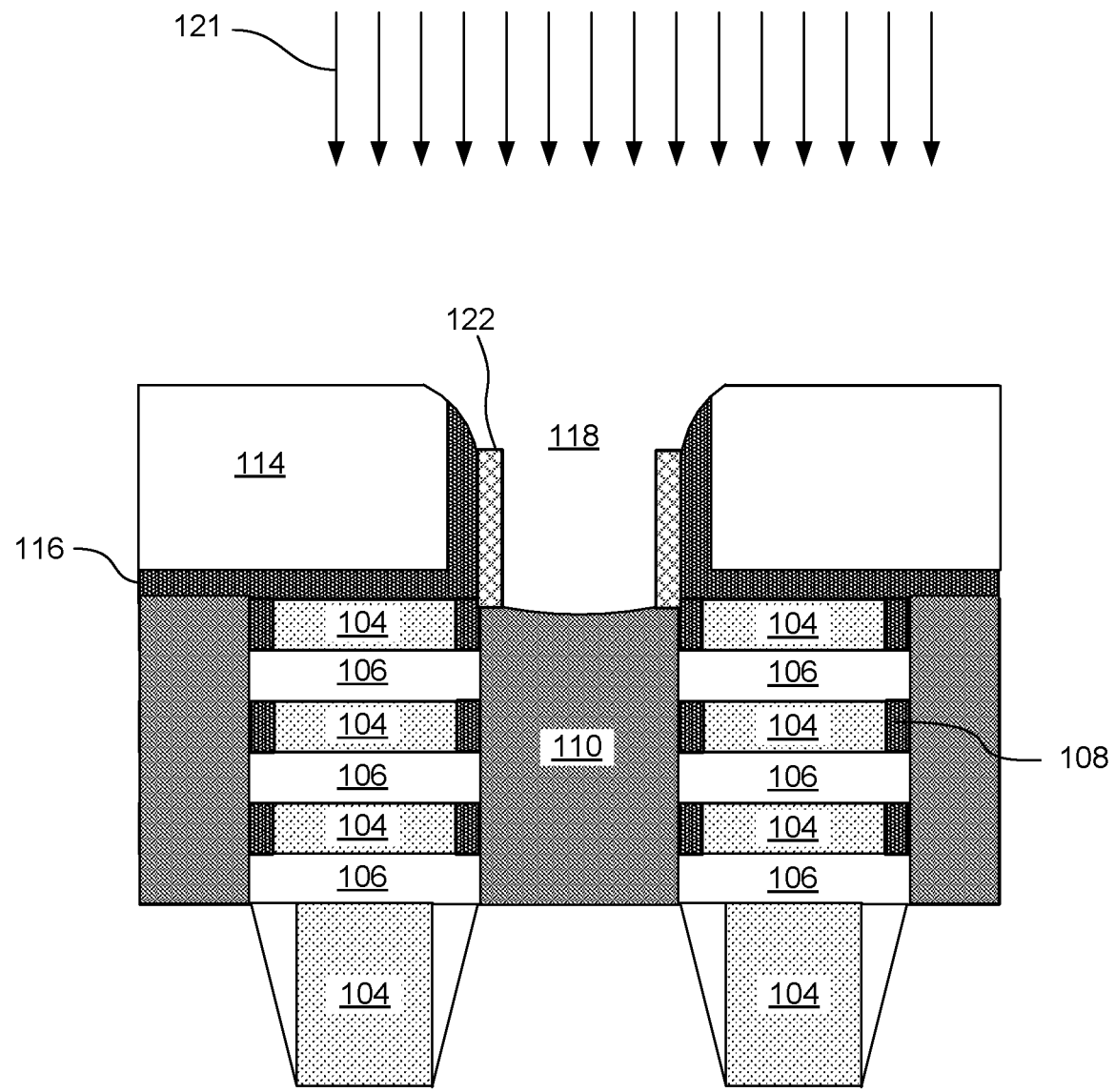

FIG. 1G illustrates a deposition process by which a dummy material layer 122 is deposited on the work piece. The dummy layer 122 may be deposited using an atomic layer deposition (ALD) process. The dummy layer 122 may include silicon, silicon germanium, or aluminum oxide. After the dummy layer 122 is deposited, an anisotropic etching process may be applied to remove the material from the top surface of the oxide layer and the top surface of the exposed 110 source/drain structure. After this etching process, the dummy layer 122 remains on sidewalls of the opening.

Figure 1H:
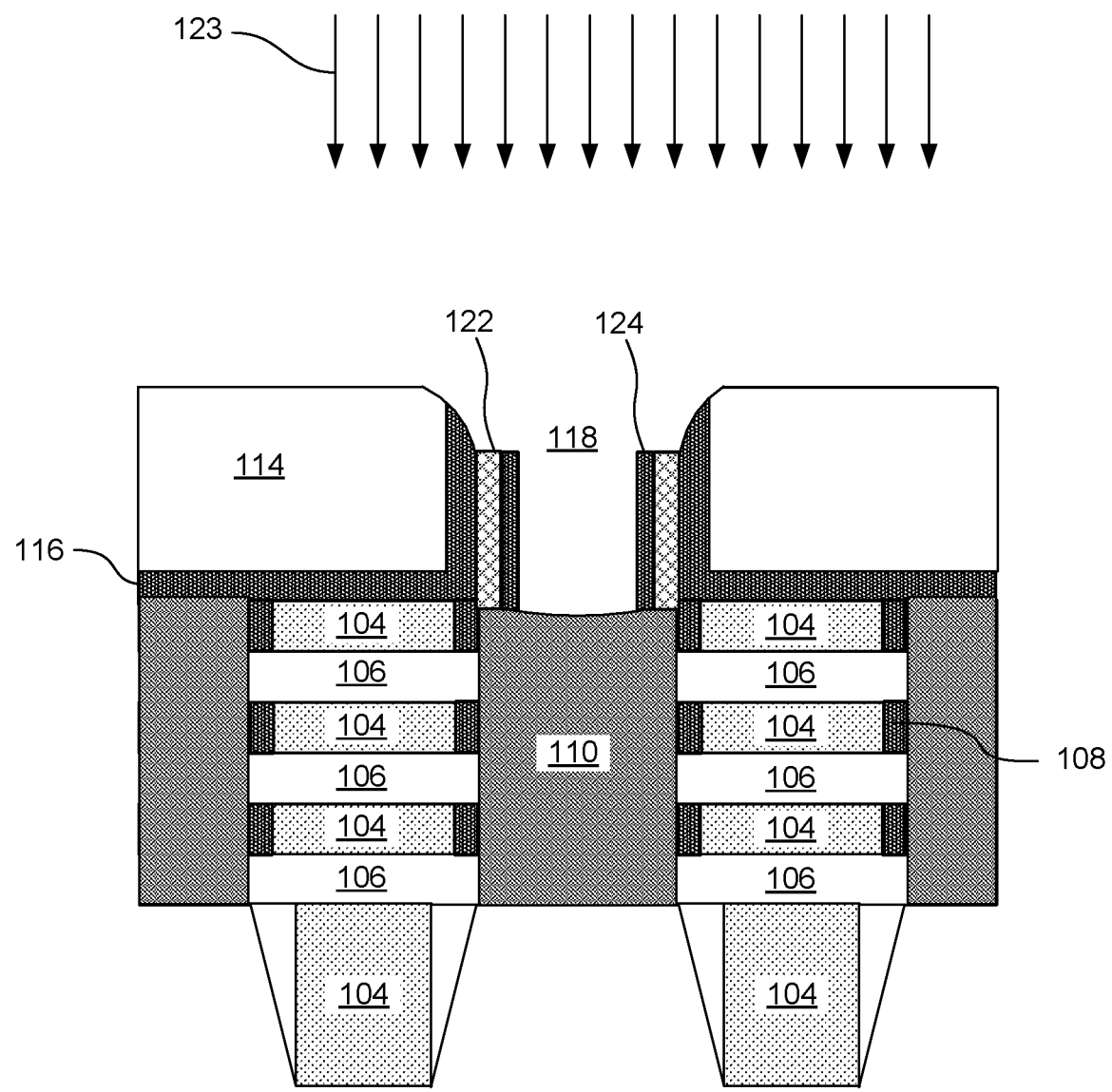

FIG. 1H illustrates a process 123 by which a dielectric layer 124 is deposited on the dummy material layer 122. The dielectric layer 124 may include silicon nitride. After the dielectric layer 124 is deposited, an anisotropic dry etching process may be applied to remove the dielectric material from the top surface of the oxide layer 114 and the source/drain layer 110. The dielectric layer 124 may be formed using an ALD process.

Figure 1I:
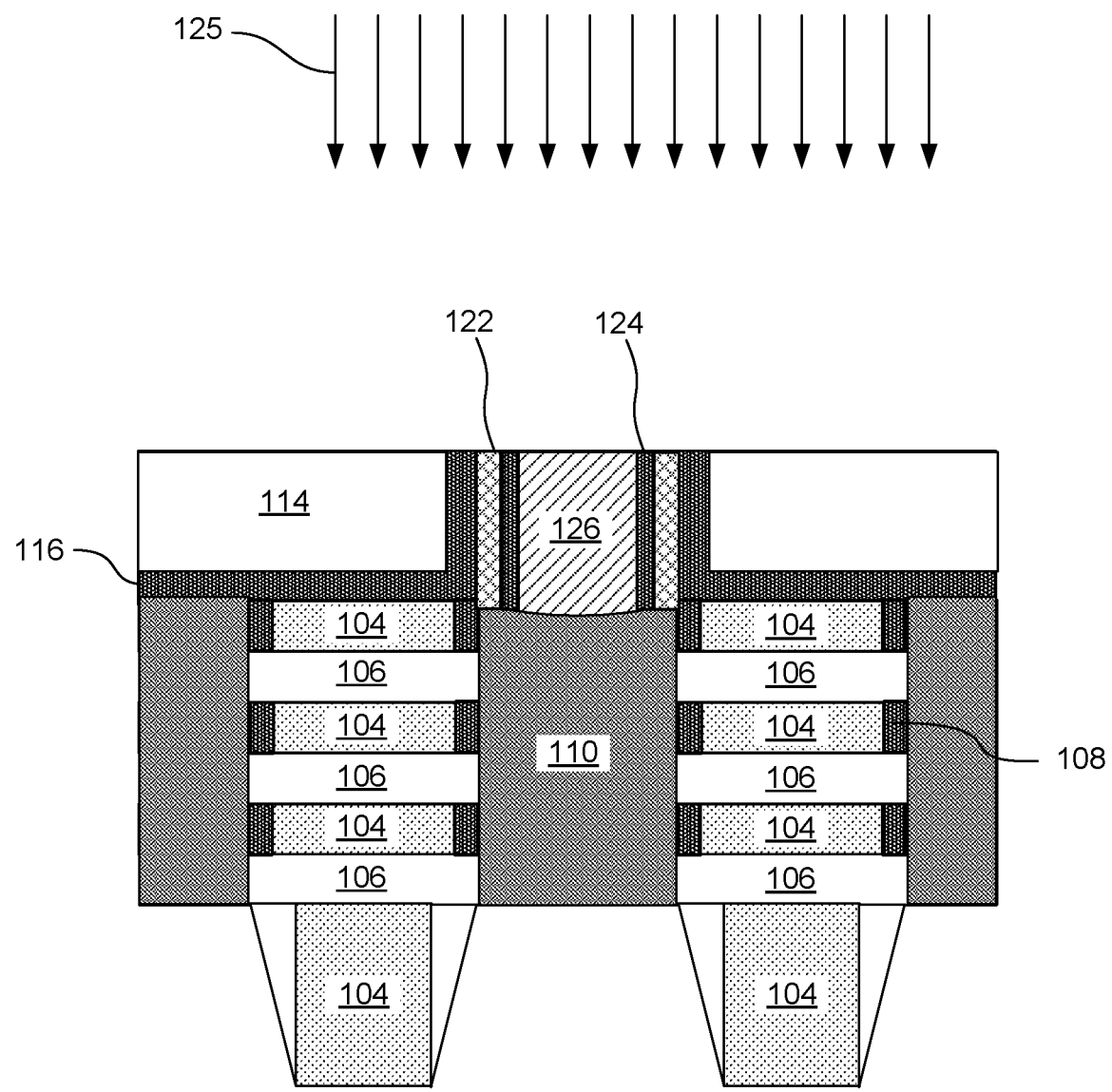

FIG. 1I illustrates a deposition process 125 by which a metal plug 126 is formed. The metal plug 126 may be a cobalt material deposited using CVD, ECP. In some examples, the metal plug 126 may be tungsten, ruthenium, or molybdenum, deposited by CVD. In some examples, before the metal plug is formed, the opening 118 may be cleaned with a TiSi process. After the metal plug is formed, a CMP process may be applied to planarize the backside surface of the wafer.

Figure 1J:
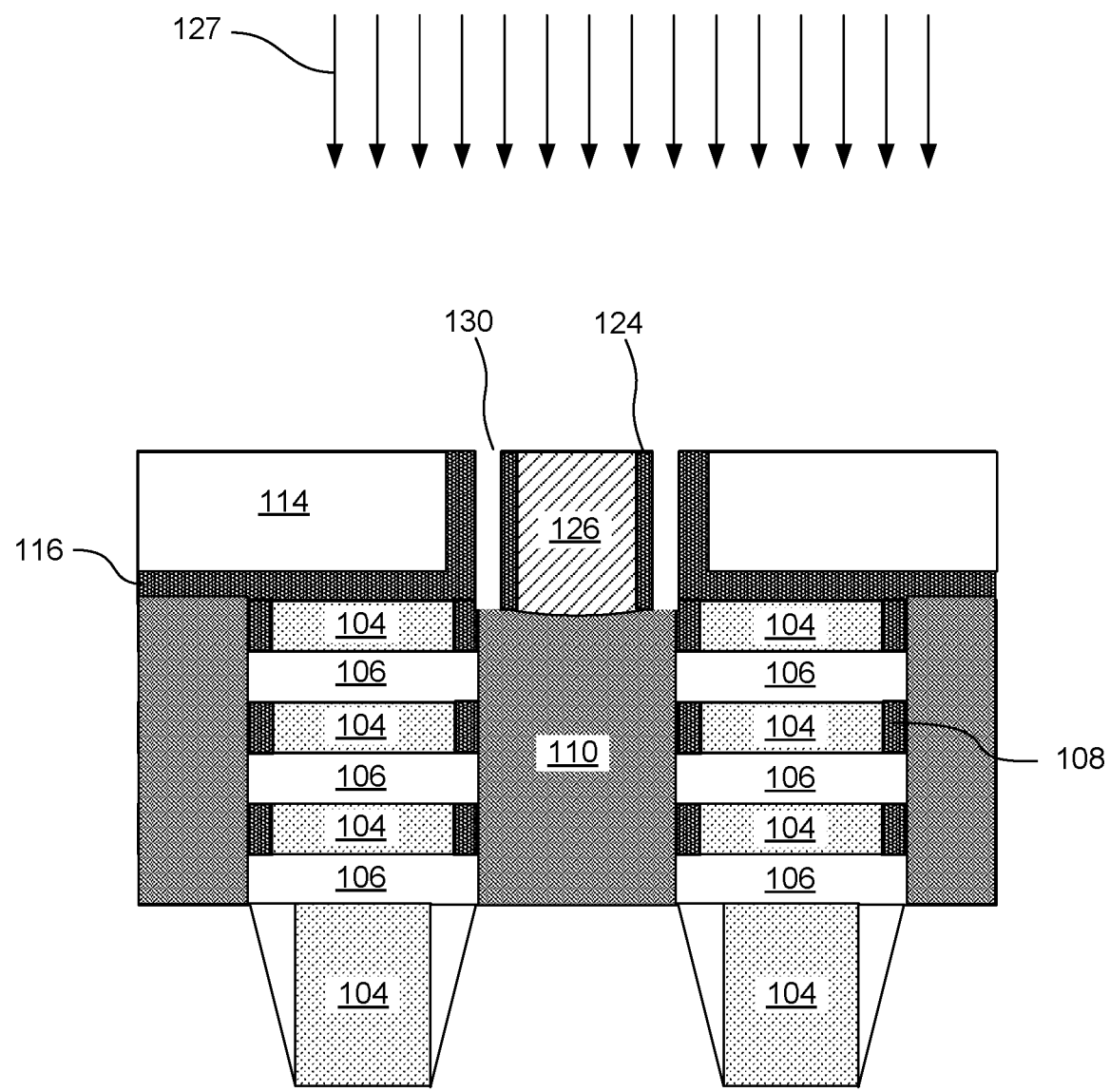

FIG. 1J illustrates a process 127 by which the dummy material 122 is removed. This may be done using either an isotropic or anisotropic process that is selective so as to remove the dummy material 122 while leaving the oxide layer 114, dielectric layer 116, dielectric layer 124, and metal plug 126 substantially intact. Removal of the dummy material 122 leaves an air gap 130 between the first dielectric layer 116 and the second dielectric layer 124.

Figure 1K:
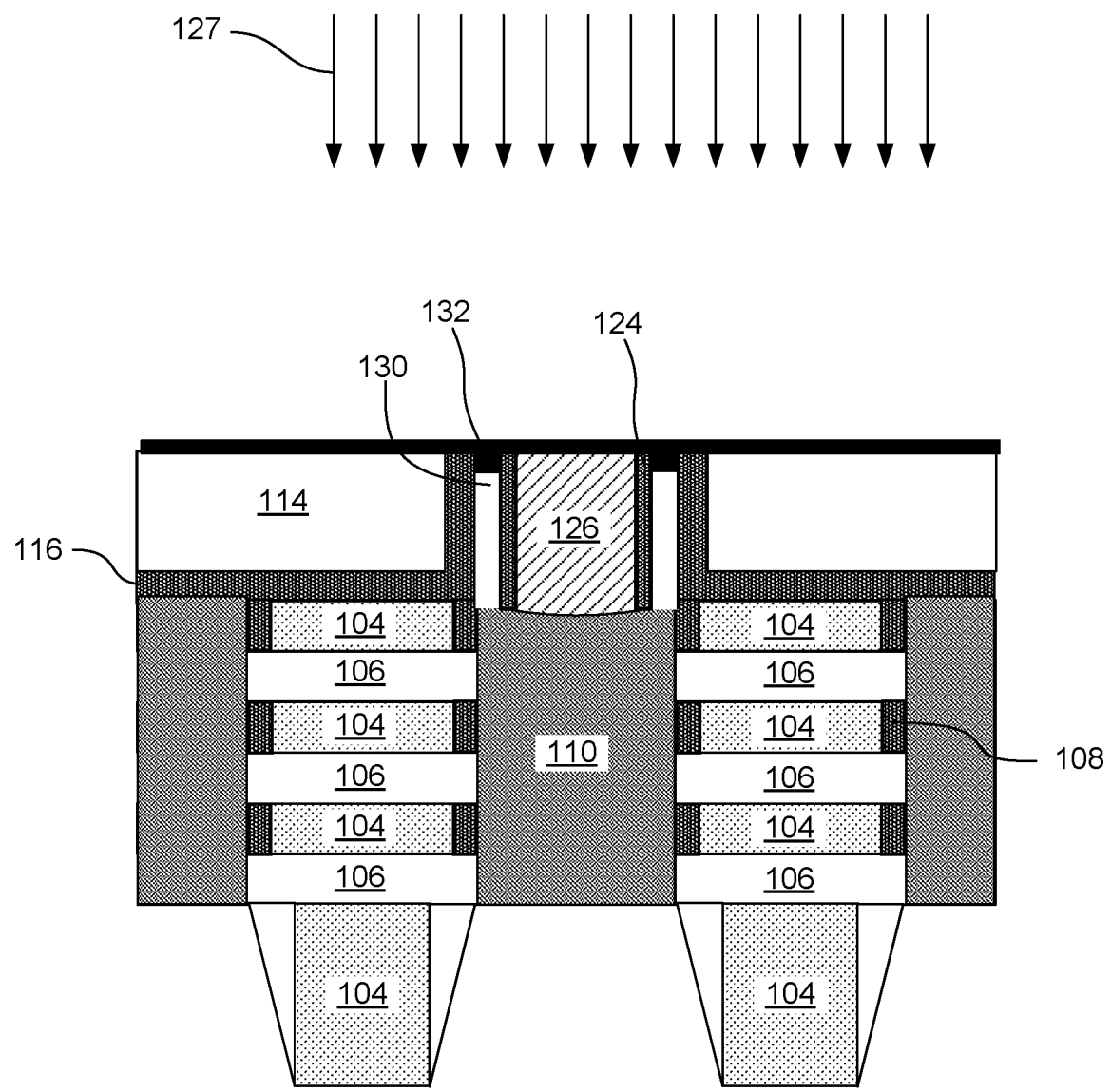

FIG. 1K illustrates the deposition of a sealing layer 132 on the work piece. The sealing layer 132 may include silicon nitride. The sealing layer 132 may be deposited using an ALD process such as a Plasma Enhanced ALD (PE-ALD) process. The sealing layer 132 closes the air gap 130 at the top. The air gap provides improved device performance because it reduces the parasitic capacitance between the metal plug 126 and the metal gate 104 devices. In other words, this improves the performance of the transistor because there is less parasitic capacitance between the contact (plug 126) and the gate 104 of the transistor device.

Figure 2:
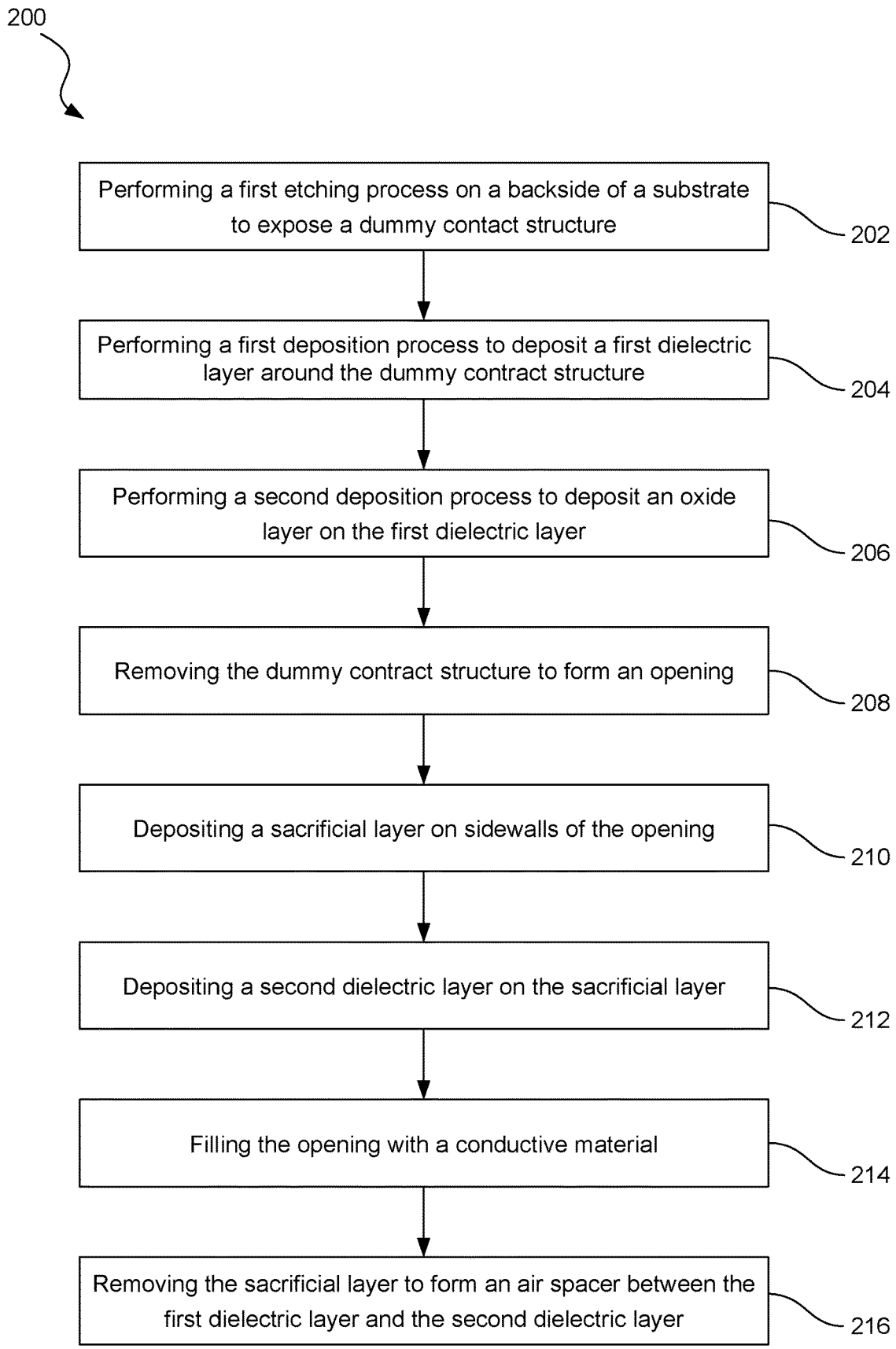
FIG. 2 is a flowchart showing an illustrative method for forming a backside contact with an air spacer, according to one example of principles described herein.

FIG. 2 is a flowchart showing an illustrative method for forming a backside contact with an air spacer. According to the present example, the method 200 includes a process 202 for performing a first etching process (e.g., 111) on a backside of a substrate (e.g., 102) to expose a dummy contact structure (e.g., 112). This removal process may be, for example, a wet etching process. The wet etching process may be selective so as to remove the semiconductor substrate while leaving the dummy source contact structure substantially intact.

The method 200 further includes a process 204 for performing a first deposition process to deposit a first dielectric layer (e.g., 116) around the dummy contact structure. The dielectric layer 116 may be, for example, a SiN layer (ALD deposition). The dielectric layer may be formed using a deposition process such as atomic layer deposition (ALD), or chemical vapor deposition (CVD).

The method 200 further includes a process 206 for performing a second deposition process to deposit an oxide layer (e.g., 114) on the first dielectric layer. After the oxide layer is formed, a CMP process may be used to planarize the backside surface of the wafer.

The method further includes a process 208 for removing the dummy contact structure to form a trench (e.g., 118). This may be done with an etching process that is selective so that the dummy structure is removed while the first dielectric layer and the oxide layer are left substantially intact. The etching process may be an anisotropic etching process such as a dry-etching process.

The method further includes a process 210 for depositing a sacrificial layer (e.g., 122, also referred to as a dummy material) on sidewalls of the trench. The sacrificial layer may be deposited using an atomic layer deposition (ALD) process. The sacrificial layer may include silicon, silicon germanium, or aluminum oxide. After the sacrificial layer is deposited, an anisotropic etching process may be applied to remove the material from the top surface of the oxide layer and the top surface of the exposed source/drain structure. After this etching process, the sacrificial layer remains on sidewalls of the opening.

The method further includes a process 212 for depositing a second dielectric layer (e.g., 124) on the sacrificial layer. The dielectric layer may include silicon nitride. After the dielectric layer is deposited, an anisotropic dry etching process may be applied to remove the dielectric material form the top surface of the oxide layer and the source/drain layer. The dielectric layer may be formed using an ALD process.

The method 200 further includes a process 214 for filling the trench with a conductive material. This forms a metal plug (e.g., 126). The metal plug 126 may be a cobalt material deposited using CVD, ECP. In some examples, the metal plug may be tungsten, ruthenium, or molybdenum, deposited by CVD. In some examples, before the metal plug is formed, the opening (or trench) may be cleaned with a TiSi process. After the metal plug is formed, a CMP process may be applied to planarize the backside surface of the wafer.

The method 200 further includes a process 216 for removing the sacrificial layer to form an air spacer (e.g., 130) between the first dielectric layer and the second dielectric layer. This may be done using either an isotropic or anisotropic process that is selective so as to remove the sacrificial layer while leaving the oxide layer, first dielectric layer, second dielectric layer, and metal plug substantially intact. Removal of the sacrificial layer leaves an air gap between the first dielectric layer and the second dielectric layer. In some examples, after the air gap is formed, a sealing layer (e.g., 132) may be deposited. The sealing layer may include silicon nitride. The sealing layer may be deposited using an ALD process such as a Plasma Enhanced ALD (PE-ALD) process. The sealing layer closes the air gap at the top. The air gap provides improved device performance because it reduces the parasitic capacitance between the metal plug and the metal gate devices.

According to one example, a method includes performing a first etching process on a backside of a substrate to expose a dummy contact structure, performing a first deposition process to deposit a first dielectric layer around the dummy contract structure, performing a second deposition process to deposit an oxide layer on the first dielectric layer, removing the dummy contract structure to form a trench, depositing a sacrificial layer on sidewalls of the trench, depositing a second dielectric layer on the sacrificial layer, filling the trench with a conductive material, and removing the sacrificial layer to form an air spacer between the first dielectric layer and the second dielectric layer.

According to one example, a method includes applying an etching process to remove a dummy contact structure from a backside of a substrate and expose a source/drain region at a bottom of a trench, depositing a sacrificial layer on sidewalls of the trench, depositing a dielectric layer on the sacrificial layer, filling the trench with a conductive material, and removing the sacrificial layer.

A semiconductor structure includes a substrate having a frontside and a backside, a transistor formed on the frontside of the substrate, the transistor comprising a source/drain region, a contact extending from a bottom of the source/drain region to the backside of the substrate, and a first dielectric layer positioned along sides of the contact, an air gap positioned between the first dielectric layer and a second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a substrate,
      an active region over the substrate and including a source/drain feature, and a dummy contact structure embedded in the substrate and below the active region;

performing a first etching process on a backside of the substrate to expose the dummy contact structure;

performing a deposition process to deposit a first dielectric layer around the dummy contact structure and below a bottom surface of the active region;

removing the dummy contact structure to form a trench;

depositing a sacrificial layer on sidewalls of the trench;

filling the trench with a conductive plug; and removing the sacrificial layer to form an air spacer between the first dielectric layer and the conductive plug.

2. The method of claim 1, further comprising:

before the forming of the sacrificial layer, depositing a bottom antireflective coating (BARC) layer in the trench;

performing an isotropic etch process to a top portion of the first dielectric layer to widen the trench; and removing the BARC layer by ashing.

3. The method of claim 1, further comprising:

forming a second dielectric layer along a sidewall of the sacrificial layer in the trench, wherein the air spacer is disposed between the first dielectric layer and the second dielectric layer.

4. The method of claim 1, further comprising:

forming an oxide layer over the first dielectric layer; and planarizing the first dielectric layer and the oxide layer to expose a bottom surface of the dummy contact structure.

5. The method of claim 1, further comprising:

depositing a sealing layer over the air spacer, such that a portion of the sealing layer is disposed between the first dielectric layer and the conductive plug.

6. The method of claim 1, wherein the forming of the sacrificial layer comprises:

depositing a dummy material layer over the first dielectric layer and in the trench; and anisotropically etching the dummy material layer to remove the dummy material layer over bottom surfaces of the first dielectric layer and the source/drain feature to form the sacrificial layer.

7. The method of claim 1, further comprising:

before the filling of the trench with the conductive plug, performing a TiSi cleaning process; and after the filling of the trench with the conductive plug, planarizing the workpiece such that bottom surfaces of the first dielectric layer, the sacrificial layer, and the conductive plug are coplanar.

8. The method of claim 1, wherein the trench exposes a bottom surface of the source/drain feature.

9. The method of claim 1, wherein the removing of the sacrificial layer leaves the first dielectric layer and the conductive plug substantially intact.

10. A semiconductor structure, comprising:

an active region including a source/drain feature;

a contact protruding from a bottom surface of the source/drain feature;

a first dielectric layer disposed directly below the active region and surrounding the contact;

an air gap disposed between the contact and the first dielectric layer; and a seal disposed between the contact and the first dielectric layer, such that the air gap is disposed between the seal and the source/drain feature.

11. The semiconductor structure of claim 10, further comprising a second dielectric layer disposed adjacent the contact and directly contacting the source/drain feature.

12. The semiconductor structure of claim 10, wherein the air gap is directly below the source/drain feature.

13. The semiconductor structure of claim 10, further comprising a second dielectric layer disposed below the first dielectric layer and surrounding the contact and a portion of the first dielectric layer.

14. The semiconductor structure of claim 10, further comprising a plurality of semiconductor nanostructures in contact with the source/drain feature.

15. The semiconductor structure of claim 14, further comprising a gate stack to wrap around each of the plurality of semiconductor nanostructures.

16. The semiconductor structure of claim 10, wherein the first dielectric layer includes silicon nitride.

17. A semiconductor structure comprising:

a source/drain feature;

at least one channel member in contact with the source/drain feature;

a contact disposed below and electrically coupled to the source/drain feature;

a first dielectric layer disposed below the at least one channel member and surrounding the contact; and an air gap disposed between the first dielectric layer and the contact, wherein a bottom of the source/drain feature is exposed to the air gap.

18. The semiconductor structure of claim 17, further comprising a second dielectric layer adjacent the contact, such that the air gap is disposed between the first dielectric layer and the second dielectric layer.

19. The semiconductor structure of claim 17, further comprising a sealing layer to close the air gap, wherein the sealing layer includes silicon nitride.

20. The semiconductor structure of claim 19, wherein the sealing layer is disposed over bottom surfaces of the first dielectric layer.

* * * * *